(12) United States Patent
Borichevsky

(10) Patent No.: US 9,336,990 B2
(45) Date of Patent: May 10, 2016

(54) SEMICONDUCTOR PROCESS PUMPING ARRANGEMENTS

(71) Applicant: Varian Semiconductor Equipment Associates, Inc., Gloucester, MA (US)

(72) Inventor: Steven C. Borichevsky, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 432 days.

(21) Appl. No.: 14/013,744

(22) Filed: Aug. 29, 2013

(65) Prior Publication Data

US 2015/0060691 A1   Mar. 5, 2015

(51) Int. Cl.
| F01D 1/36 | (2006.01) |
| F03B 5/00 | (2006.01) |
| F04B 35/04 | (2006.01) |
| F04B 35/00 | (2006.01) |
| H01J 37/317 | (2006.01) |
| F04D 19/04 | (2006.01) |
| F04D 29/64 | (2006.01) |

(52) U.S. Cl.
CPC ........... *H01J 37/3171* (2013.01); *F04D 19/042* (2013.01); *F04D 29/644* (2013.01); *H01J 2237/006* (2013.01); *H01J 2237/1825* (2013.01)

(58) Field of Classification Search
CPC ....... F04D 19/04; F04D 19/042; F04D 5/001; F04D 17/161; F04D 17/168; F04D 29/644; F04B 37/09; F04B 37/08; H01J 37/301; H01J 37/3171; H01J 37/3172
USPC ........... 415/90, 213.1, 214.1; 417/423.4, 360; 62/55.5; 250/492.21, 492.2, 454.11
See application file for complete search history.

(56) References Cited

U.S. PATENT DOCUMENTS

| 4,449,373 | A | * | 5/1984 | Peterson | ................. | F04B 37/08 62/55.5 |
| 4,611,467 | A | * | 9/1986 | Peterson | ................. | F04B 37/08 62/55.5 |
| 4,672,210 | A | * | 6/1987 | Armstrong | .......... | H01J 37/3171 250/492.2 |
| 4,787,829 | A | * | 11/1988 | Miyazaki | .............. | F04D 19/048 415/90 |
| 4,800,100 | A | * | 1/1989 | Herbots | ................ | C23C 14/221 250/492.21 |
| 4,822,251 | A | * | 4/1989 | Amrath | ............... | F04D 15/0094 415/90 |
| 5,051,060 | A | * | 9/1991 | Fleischmann | ......... | F04D 19/044 415/90 |
| 5,219,269 | A | * | 6/1993 | Ikegami | .................. | F04D 19/04 415/90 |
| 5,244,820 | A | * | 9/1993 | Kamata | ................. | H01L 21/265 250/492.2 |
| 5,343,047 | A | * | 8/1994 | Ono | ..................... | H01J 37/3171 250/492.21 |
| 5,932,882 | A | * | 8/1999 | England | .............. | H01J 37/3171 250/492.21 |
| 6,257,001 | B1 | * | 7/2001 | Muldowney | ............ | F04B 37/08 62/125 |

(Continued)

*Primary Examiner* — Thai Ba Trieu

(57) ABSTRACT

A semiconductor process pump configured to mitigate losses in pump speed during operation. The semiconductor process pump may include a housing having an inlet port for receiving gas molecules therethrough, wherein a forward-most terminus of the inlet port defines an inlet face, one or more working surfaces disposed within the housing, and a mounting flange disposed on an exterior of the housing for facilitating attachment of the pump to a gas enclosure, wherein a forward-most terminus of the mounting flange defines a flange face. The flange face may be offset from the inlet face rearwardly along the housing by a distance d. Thus, when the semiconductor process pump is mounted to a wall of a gas enclosure, the housing may extend into the wall and the inlet face may be disposed within or immediately adjacent the interior of the gas enclosure.

10 Claims, 7 Drawing Sheets

(56) References Cited

U.S. PATENT DOCUMENTS

| | | | |
|---|---|---|---|
| 6,499,942 B1 * | 12/2002 | Nonaka | F04D 19/042 415/90 |
| 6,607,365 B1 * | 8/2003 | Kabasawa | F04D 19/04 417/423.4 |
| 6,620,250 B2 * | 9/2003 | Brezoczky | C23C 14/56 118/715 |
| 6,727,509 B2 * | 4/2004 | Pharand | H01J 37/3171 250/454.11 |
| 7,249,939 B2 * | 7/2007 | Yanagihara | F04D 13/025 417/420 |
| 7,790,586 B2 * | 9/2010 | Sasaki | H01L 21/2236 438/513 |
| 8,471,199 B1 * | 6/2013 | Doroshenko | H01J 49/0013 250/281 |
| 2005/0133736 A1 * | 6/2005 | Chen | H01J 37/3171 250/492.21 |
| 2013/0181139 A1 * | 7/2013 | Eisner | H01J 37/3171 250/396 R |
| 2013/0336762 A1 * | 12/2013 | Kogame | F04D 19/042 415/9 |
| 2015/0170877 A1 * | 6/2015 | Bettencourt | H01J 37/3171 417/49 |

* cited by examiner

US 9,336,990 B2

SEMICONDUCTOR PROCESS PUMPING ARRANGEMENTS

FIELD OF THE DISCLOSURE

The disclosure relates generally to the field of semiconductor device fabrication, and more particularly to high efficiency semiconductor process pumping arrangements for use in ion implantation systems.

BACKGROUND OF THE DISCLOSURE

Ion implantation is a technique for introducing conductivity-altering impurities into semiconductor workpieces. During ion implantation, a desired impurity material is ionized in an ion source chamber, the ions are accelerated to form an ion beam of prescribed energy, and the ion beam is focused and directed at the surface of a workpiece positioned in a process chamber. The energetic ions in the ion beam penetrate into the bulk of the workpiece material and are embedded into the crystalline lattice of the material to form a region of desired conductivity.

During the ion implantation process, the ionization of impurity materials and the interaction of an ion beam with a workpiece can generate undesirable gases that must be evacuated from an ion source chamber and a process chamber, respectively, in order to prevent contamination of the chambers and the workpiece. To that end, semiconductor process pumps that are capable of rapidly evacuating such gases are commonly installed at various locations throughout ion implanters. For example, turbomolecular pumps (commonly referred to as "turbopumps") are often installed on or adjacent to ion source chambers of ion implanters for evacuating gases (e.g., boron, arsenic, argon, etc.) that are produced during ionization of impurity materials. Similarly, cryogenic pumps (often referred to as "cryopumps") are typically installed on process chambers of ion implanters for evacuating gases (e.g., water vapor, hydrogen, etc.) produced when an ion beam strikes a workpiece.

Semiconductor process pumps are typically expensive and can have a significant impact on the overall cost of an ion implanter. It is therefore generally desirable to reduce the total number of such pumps required. This can be done by maximizing pump speeds (i.e., the rate at which gases are evacuated by a pump) so that a fewer total number of pumps must be implemented in a particular application to achieve sufficiently rapid evacuation of gases.

Pump speed is greatly affected by the physical distance between the working surfaces of a pump (e.g., rotors and stators of turbopumps and low-temperature surfaces of cryopumps) and gases that are to be evacuated. Thus, since semiconductor process pumps are generally mounted on the exterior surfaces of ion source chamber walls and process chamber walls, the thicknesses of such walls can be a significant confounding factor with regard to pumping efficiency. For example, at pressures below $1\times10^{-2}$ pascals, chamber walls having thicknesses of 1-2 inches can reduce pump efficiency by 25 percent or more of vacuum pump with a 250 mm inlet diameter. Furthermore, semiconductor process pumps typically include mounting flanges which facilitate attachment to chamber walls. Such flanges further separate the working surfaces of pumps from the interiors of ion source and process chambers and thus further reduce pump efficiency. Still further, in the case of cryopumps, a gate valve must typically be installed intermediate the inlet of a pump and a process chamber wall so that the pump can be closed off from the interior of the process chamber to facilitate periodic regeneration of the working surfaces of the pump. Such gate valves further separate the working surfaces of cryopumps from the interiors of process chambers and may further reduce pump efficiencies by as much as 30 percent.

Due to the above-described losses, it is often necessary to use multiple turbopumps and multiple cryopumps in an ion implanter in order to achieve necessary rates of gas evacuation, despite the fact that a single turbopump and/or a single cryopump may be capable of achieving the necessary evacuation rates if the full, or near full, efficiencies of such pumps could be realized during operation. Thus, there is a need for an improved arrangement for turbopumps and cryopumps that can reduce the total number of such pumps required for an ion implantation system.

SUMMARY

In view of the foregoing, it would be advantageous to provide semiconductor process pumps, including turbopumps and cryopumps, as well as complementary chamber and valve structures, which are configured to mitigate losses in pump efficiencies.

An exemplary semiconductor process pump in accordance with the present disclosure may include a housing having an inlet port for receiving gas molecules therethrough, wherein a forward-most terminus of the inlet port defines an inlet face, one or more working surfaces disposed within the housing, and a mounting flange disposed on an exterior of the housing for facilitating attachment of the pump to a gas enclosure, wherein a forward-most terminus of the mounting flange defines a flange face. The flange face may be offset from the inlet face rearwardly along the housing by a distance d. Thus, when the semiconductor process pump is mounted to a wall of a gas enclosure, the housing may extend forward from the mounting flange, into the wall, and the inlet face may be disposed within or immediately adjacent the interior of the gas enclosure. Losses in pump speed that would otherwise be result from a separation between the interior of the gas enclosure and the working surfaces of the semiconductor process pump are thereby mitigated or eliminated.

An exemplary ion implanter in accordance with the present disclosure may include a gas enclosure defined by at least one wall having an exterior surface and an interior surface. The ion implanter may further include a semiconductor process pump mounted on the at least one wall, the semiconductor process pump including a housing having an inlet port for receiving gas molecules therethrough, one or more working surfaces disposed within the housing, and a mounting flange disposed on an exterior of the housing and fastened to the exterior surface of the at least one wall. The housing may extend forward from the mounting flange and into an aperture that extends through the at least one wall. The inlet port of the semiconductor pump may therefore be disposed within or immediately adjacent the interior of the gas enclosure. Losses in pump speed that would otherwise result from a separation between the interior of the gas enclosure and the working surfaces of the semiconductor process pump are thereby mitigated or eliminated.

DETAILED DESCRIPTION

Figure 1:
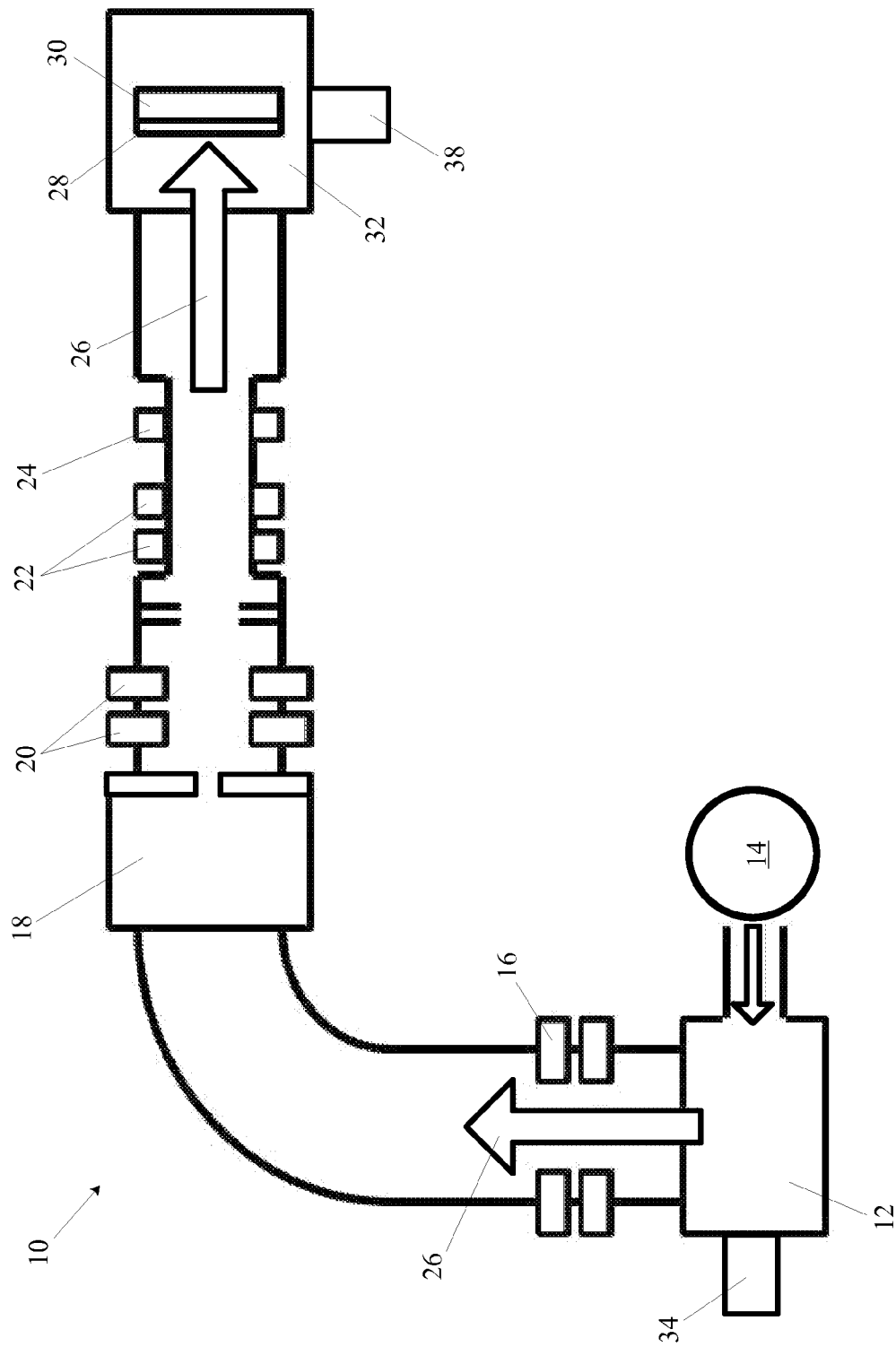
FIG. 1 is a schematic view illustrating an exemplary ion implanter in accordance with the present disclosure.

A system in accordance with the present disclosure will now be described more fully hereinafter with reference to the accompanying drawings, in which preferred embodiments of the device are shown. This system, however, may be embodied in many different forms and should not be construed as being limited to the embodiments set forth herein. Rather, these embodiments are provided so that this disclosure will be thorough and complete, and will fully convey the scope of the device to those skilled in the art. In the drawings, like numbers refer to like elements throughout.

Referring to FIG. 1, an exemplary embodiment of an ion implanter 10 in accordance with the present disclosure is shown. The ion implanter 10 may include an ion source chamber 12 for receiving a quantity of impurity materials 14 (e.g., boron, arsenic, phosphorous, argon, etc.) and ionizing such materials using ionization processes that will be familiar to those of ordinary skill in the art. The ion implanter 10 may further include a series of beam line components, including, but not limited to, pre-acceleration electrodes 16, a mass spectrometer 18, acceleration electrodes 20, and a plurality of magnets 22 and lenses 24, for example. These components may operate in a predefined manner to form an ion beam 26 of the ionized impurity molecules generated in the ion source chamber 12, and to focus and direct the ion beam 26 onto the surface of a workpiece 28 (e.g., a silicon substrate) mounted on a platen 30 in a process chamber 32. The workpiece 28 may thereby be implanted with the ions in the ion beam 26 to form a region of desired conductivity within the workpiece 28.

The exemplary ion implanter 10 may also include one or more semiconductor process pumps, including turbopumps and/or cryopumps, for evacuating gas molecules from certain portions, generically referred to as "gas enclosures," of the ion implanter 10. The evacuation of such gas molecules may prevent contamination of the implanter's components and the workpiece 28 during ion implantation. For example, as shown in FIG. 1, a turbopump 34 (described in greater detail below) may be mounted to the ion source chamber 12 of the ion implanter 10 for evacuating undesirable gases (e.g., boron, argon, phosphorous, or arsenic gases) that may be generated during the ionization of impurity materials therein. Additionally, a cryopump 38 (described in greater detail below) may be mounted to the process chamber 32 of the ion implanter 10 for evacuating undesirable gases (e.g., water vapor and/or hydrogen gas) that may be created when the ion beam 26 strikes the workpiece 28 therein. While only a single turbopump 34 and a single cryopump 38 are shown in FIG. 1, it is contemplated that the ion implanter 10 may include more than one turbopump and/or more than one cryopump installed at various locations throughout the ion implanter 10 without departing from the scope of the present disclosure.

Figure 2:
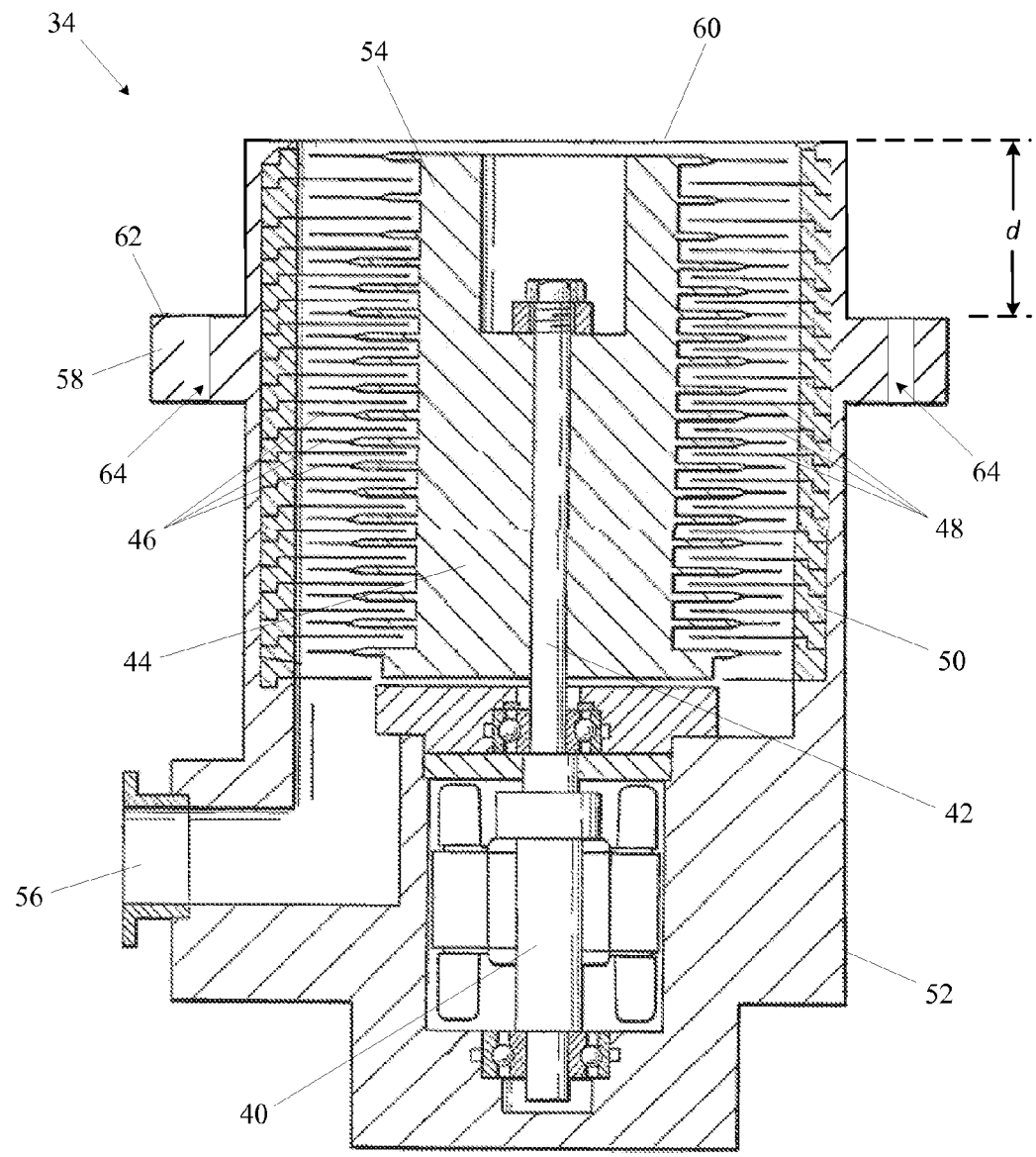
FIG. 2 is a view in section illustrating a turbomolecular pump in accordance with the present disclosure.

Referring to FIG. 2, a cross-sectional side view of the exemplary turbopump 34 in accordance with the present disclosure is shown. For the sake of convenience with regard to the following description, the side of the turbopump 34 nearest the top of the page in FIG. 2 may be regarded as the "front" of the turbopump 34, and side of the turbopump 34 nearest the bottom of the page in FIG. 2 may be regarded as the "rear" of the turbopump 34. The turbopump 34 may include a motor 40, a motor shaft 42 for transmitting rotational force derived from the motor 40, a rotor 44 secured to and rotatably driven by the motor shaft 42, a plurality of rotor blades 46 fixed to the rotor 44, a plurality of stator blades 48 each disposed between a pair of adjacent rotor blades 46, a spacer 50 having the stator blades 48 attached thereto, a housing 52 provided with an inlet port 54 and an exhaust port 56, and a mounting flange 58.

A forward-most terminus of the inlet port 54 (i.e., the top of the inlet port 54 as oriented in FIG. 2) may define a substantially planar inlet face 60. A forward-most terminus of the mounting flange 58 may define a substantially planar flange face 62 that is substantially parallel to the inlet face 60. The flange face 62 may be recessed or offset from the inlet face 60 rearwardly (i.e., downwardly in FIG. 2) along the exterior of the housing 52 by a distance d, the significance of which will be described in greater detail below.

The mounting flange 58 of the turbopump 34 may be continuous about the periphery of the housing 52 and may have virtually any peripheral shape, including, but not limited to, circular, rectangular, triangular, or irregular. Alternatively, it is contemplated that the mounting flange 58 may be defined by a plurality of discrete, coplanar flange segments that are spaced apart from one another about the periphery of the housing 52. A plurality of mounting holes 64 may be formed through the mounting flange 58 for accepting fasteners 66 (see FIG. 3) to facilitate attachment of the mounting flange 58 to a wall 68 of the ion source chamber 12 or to other portions of the ion implanter 10 shown in FIG. 1.

During operation of the turbopump 34, the motor 40 may be driven to rotate the rotor blades 46 at a high speed relative to the stator blades 48 in a high-vacuum atmosphere sufficient to ensure that molecular flow is available. Due to the relative orientations and positions of the rotor blades 46 and stator blades 48, gas molecules may enter the inlet port 54 and the gas may be compressed at a high compression ratio within the turbopump 34 before being expelled through the exhaust port 56. Large volumes of gas may thereby be rapidly evacuated from an enclosure (e.g., the ion source chamber 12 of the ion implanter 10 in FIG. 1) to which the turbopump 34 is mounted.

Figure 3:
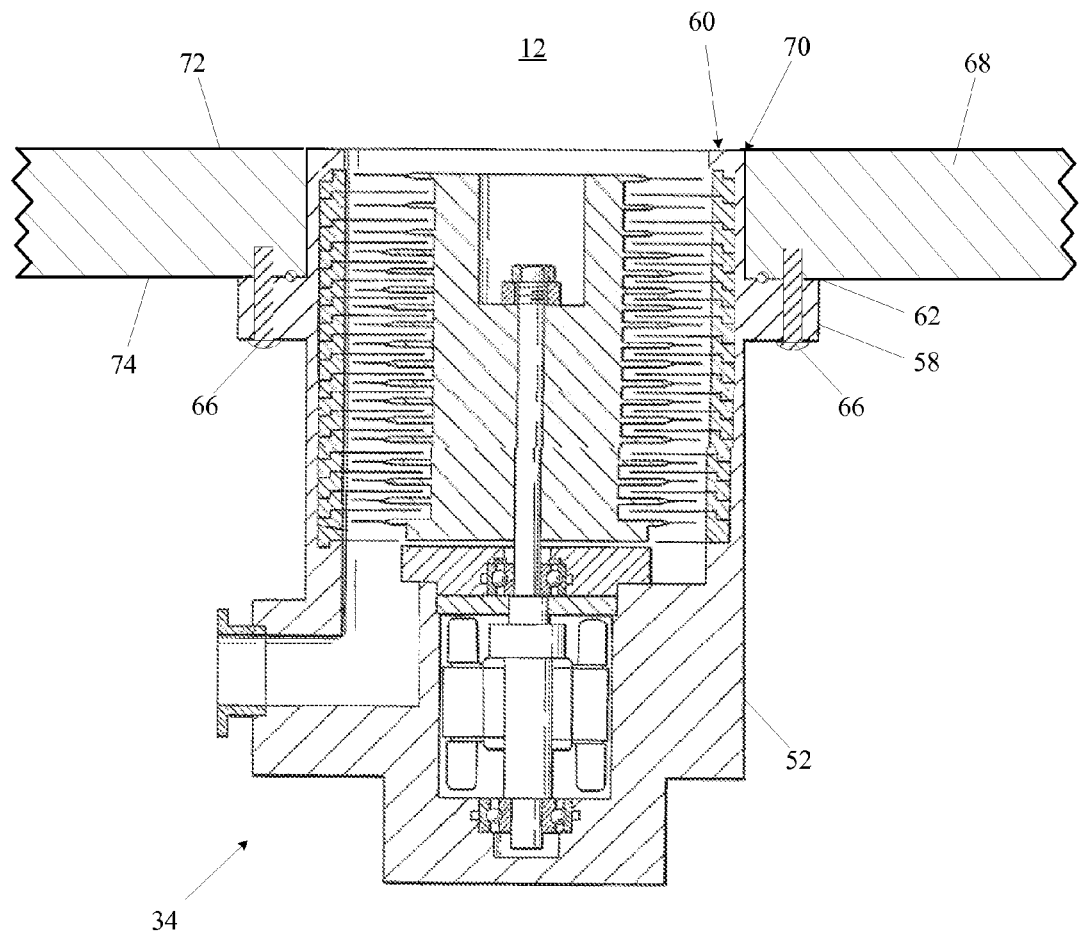
FIG. 3 is a view in section illustrating the turbomolecular pump shown in FIG. 2 mounted to the wall of an ion source chamber.

Referring to FIG. 3, a cross-sectional side view of the turbopump 34 operably mounted to the ion source chamber 12 of the ion implanter 10 (see FIG. 1) is shown. Particularly, the housing 52 of the turbopump 34 may extend into an aperture 70 formed in the wall 68 of the ion source chamber 12, wherein the aperture 70 may have a size and shape that are adapted to receive the housing 52 of the turbopump 34 in a close-clearance relationship therewith. This mating relationship between the housing 52 and the aperture 70 is facilitated by the above-described recessing or offsetting of the flange face 62 from the inlet face 60 of the turbopump 34 by the distance d (see FIG. 2). That is, the housing 52 is allowed to extend into the wall 68 the distance d without interference from the mounting flange 58. For example, as shown in FIG. 3, the distance d may be equal to the thickness of the wall 68, resulting in the inlet face 60 of the turbopump 34 being flush with the interior surface 72 of the wall 68 when the mounting flange 58 is mounted to the exterior surface 74 of the wall 68. Alternatively, it is contemplated that the distance d may be greater than the thickness of the wall 68, in which case the housing 52 would extend through the wall 68 and into the ion source chamber 12. Still further, it is contemplated that the distance d may be less than the thickness of the wall 68 (but greater than 0), in which case the housing 52 would extend into the wall 68 but short of the interior surface 72 of the wall 68.

The result of any of the above-described offset or recessed mounting flange configurations is that the inlet face 60 of the of the turbopump 34 may be positioned nearer the interior of the ion source chamber 12 relative to other turbopumps that employ mounting flanges having flange faces that are not offset or recessed relative to respective inlet faces. The inlet faces of such turbopumps are therefore separated from the interiors of respective gas enclosures by distances that are equal to or greater than the thicknesses of the walls of the enclosures, meaning that the working surfaces (i.e., rotator blades and stator blades) of such turbopumps are also separated from the interiors of their respective gas enclosures by at least such a distance. It is known that such separations may result in significant reductions in the pump speeds (i.e., the rate at which gases are evacuated by a pump) of turbopumps.

By contrast, the inlet face 60 of the turbopump 34 of the present disclosure extends into the wall 68 of the ion source chamber 12, and perhaps even into the interior of the ion source chamber 12 (i.e., if the distance d in FIG. 2 is greater than the thickness of the wall 68 in FIG. 3). The working surfaces of the turbopump 34 are thereby positioned immediately adjacent or within the interior of the ion source chamber 12 and therefore immediately adjacent or within any gases that are to be evacuated therefrom. The turbopump 34 therefore does not suffer the above-described loses in pump speed and may thus realize the full, or near full, potential pump speed of the turbopump 34 during operation. A fewer number of turbopumps may therefore be implemented in a given gas enclosure in order to achieve a desired total rate of gas evacuation.

Figure 4:
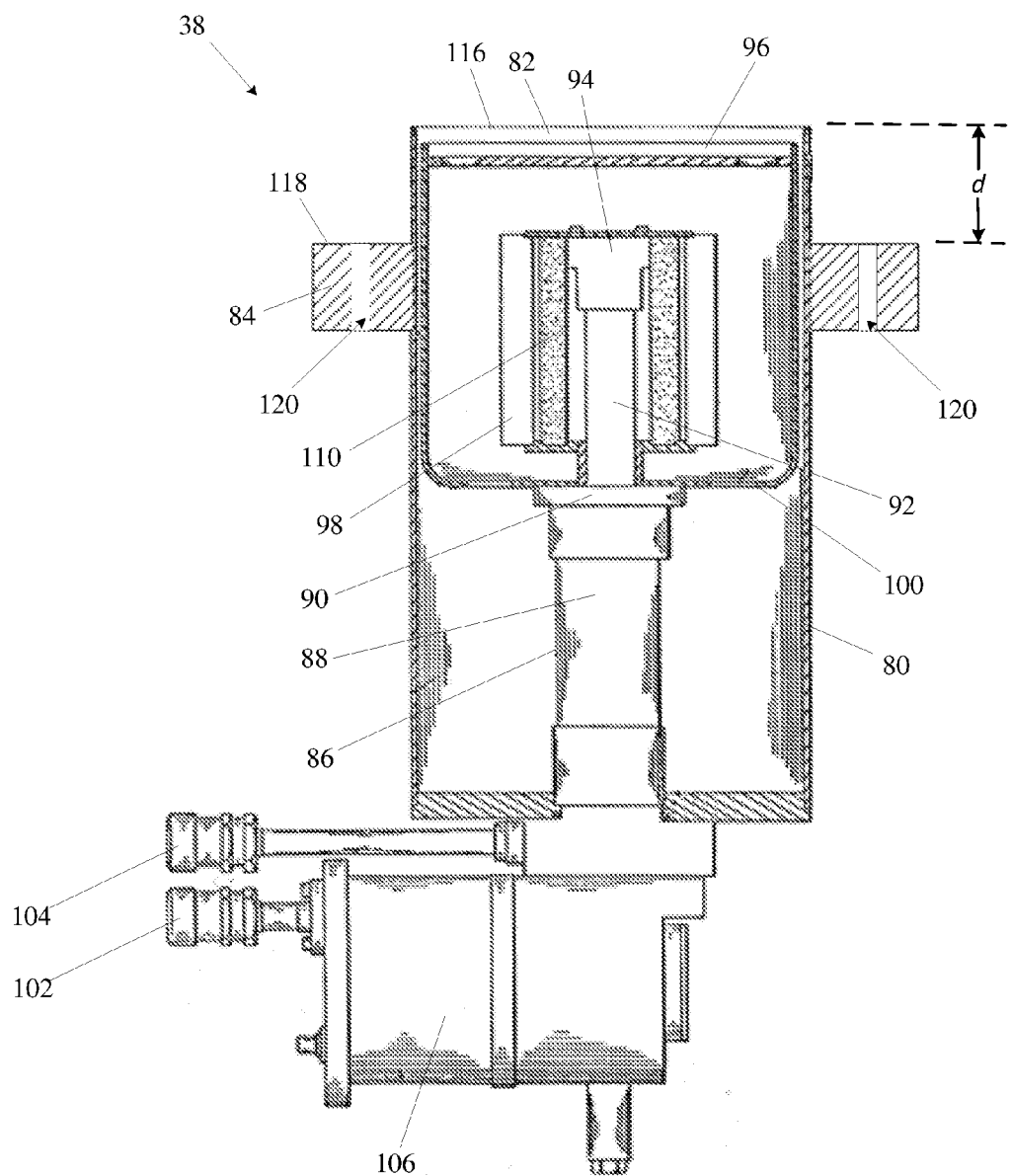
FIG. 4 is a view in section illustrating a cryogenic pump in accordance with the present disclosure.

Referring to FIG. 4, a cross-sectional side view of the exemplary cryopump 38 in accordance with the present disclosure is shown. For the sake of convenience with regard to the following description, the side of the cryopump 38 nearest the top of the page in FIG. 4 may be regarded as the "front" of the cryopump 38, and side of the cryopump 38 nearest the bottom of the page in FIG. 4 may be regarded as the "rear" of the cryopump 38. The cryopump 38 may include a main cryopump housing 80 having an inlet port 82 and a mounting flange 84. The cryopump 38 may further include a two-stage cold head 86 including a first stage refrigerator 88 having a first stage heat sink 90 and a second stage refrigerator 92 having a second stage heat sink 94, a first stage condensing surface 96, a second stage condensing array 98, a radiation shield 100, a cooling gas input line 102, a cooling gas exhaust line 104, and a motor 106. Enclosed within the second stage condensing array 98 may be an array of panels 110 that hold an adsorbent for low temperature gases.

A two-stage displacer (not shown) may be arranged within the cold head 86 and may be driven by the motor 106. With each cycle of the cryopump 38, a cooling gas, such as helium gas, may be introduced under pressure through the cooling gas input line 120 into the cold head 86 where it is expanded and thus cooled. The cooling gas may then be exhausted through the cooling gas exhaust line 104 to a compressor (not shown). The working surfaces of the cyropump 38 may thereby be cooled to sufficiently low temperatures to cause targeted gases (hydrogen, water vapor, etc.) to be condensed and removed from the surrounding environment.

A forward-most terminus of the inlet port 82 (i.e., the top of the inlet port 82 as oriented in FIG. 4) of the cyropump 38 may define a substantially planar inlet face 116. A forward-most terminus of the mounting flange 84 may define a substantially planar flange face 118 that is substantially parallel to the inlet face 116. The flange face 118 may be recessed or offset from the inlet face 116 rearwardly (i.e., downwardly in FIG. 4) along the exterior of the housing 80 by a distance d, the significance of which will be described in greater detail below.

The mounting flange 84 of the cryopump 38 may be continuous about the periphery of the housing 80 and may have virtually any peripheral shape, including, but not limited to, circular, rectangular, triangular, or irregular. Alternatively, it is contemplated that the mounting flange 84 may be defined by a plurality of discrete, coplanar flange segments that are spaced apart from one another about the periphery of the housing 80. A plurality of mounting holes 120 may be formed through the mounting flange 84 for accepting fasteners 122 (see FIG. 5) to facilitate attachment of the mounting flange 84 to a wall 124 of the process chamber 32 or to other portions of the ion implanter 10 shown in FIG. 1.

Figure 5:
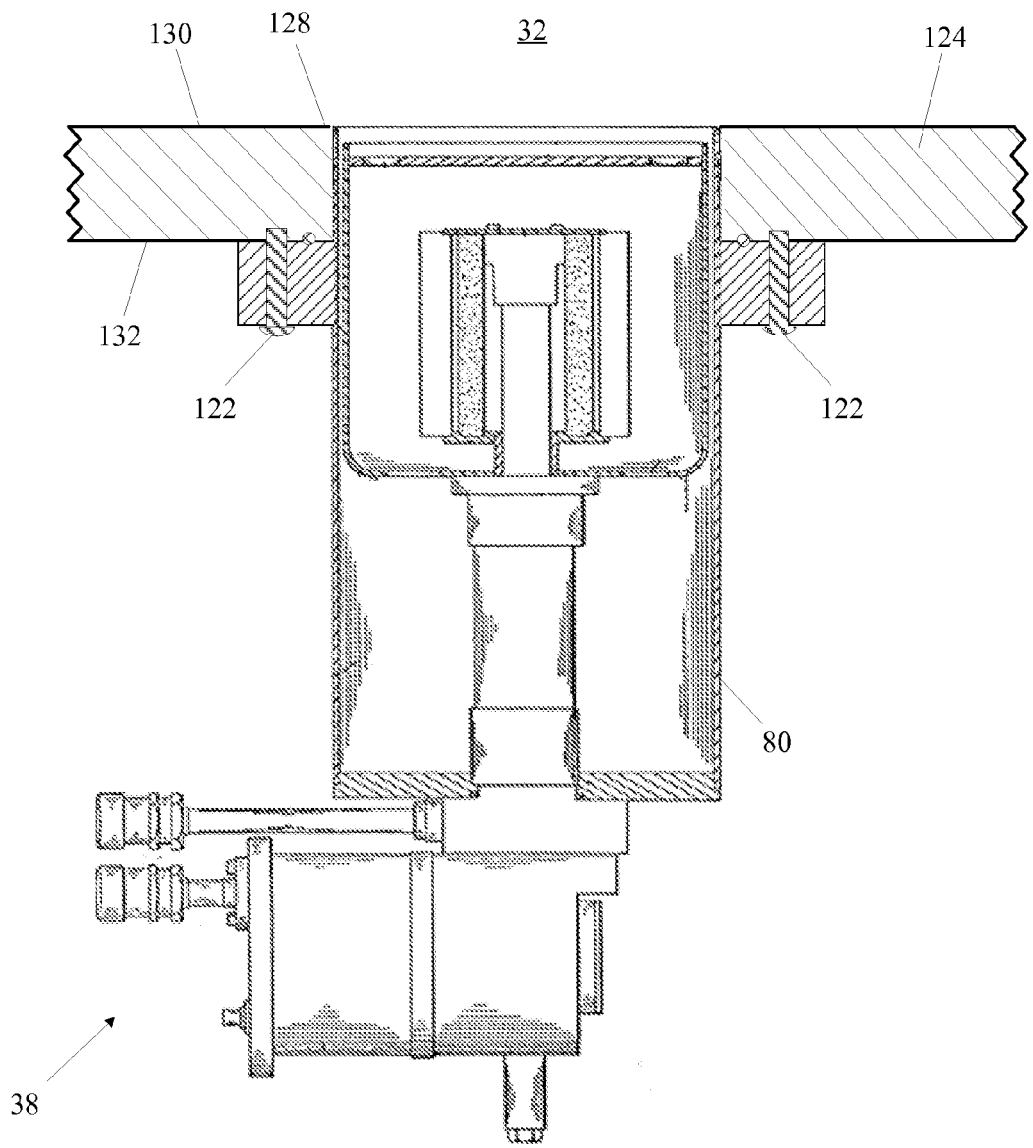
FIG. 5 is a view in section illustrating the cryogenic pump shown in FIG. 4 mounted to the wall of process chamber.

Referring to FIG. 5, a cross-sectional side view of the cryopump 38 operably mounted to the process chamber 32 of the ion implanter 10 (see FIG. 1) is shown. Particularly, the housing 80 of the cryopump 38 may extend into an aperture 128 formed in the wall 124 of the process chamber 32, wherein the aperture 128 may have a size and shape that are adapted to receive the housing 80 of the cryopump 38 in a close-clearance relationship therewith. This mating relationship between the housing 80 and the aperture 128 is facilitated by the above-described recessing or offsetting of the flange face 118 from the inlet face 116 of the cryopump 38 by the distance d (see FIG. 4). That is, the housing 80 is allowed to extend into the wall 124 the distance d without interference from the mounting flange 84. For example, as shown in FIG. 5, the distance d may be equal to the thickness of the wall 124, resulting in the inlet face 116 of the cryopump 38 being flush with the interior surface 130 of the wall when the mounting flange 84 is flatly mounted to the exterior surface 132 of the wall 124. Alternatively, it is contemplated that the distance d may be greater than the thickness of the wall 124, in which case the housing 80 would extend through the wall 124 and into the process chamber 32. Still further, it is contemplated that the distance d may be less than the thickness of the wall 124 (but greater than 0), in which case the housing 80 would extend into the wall 124 but short of the interior surface 130 of the wall 124.

The result of any of the above-described offset or recessed mounting flange configurations is that the inlet face 116 of the of the cryopump 38 may be positioned nearer the interior of the process chamber 32 relative to other cryopumps that employ mounting flanges having flange faces that are not offset or recessed relative to respective inlet faces. The inlet faces of such cryopumps are therefore separated from the interiors of respective gas enclosures by distances that are equal to or greater than the thicknesses of the walls of the enclosures, meaning that the working surfaces (i.e., condensing surfaces) of such cryopumps are also separated from the interiors of their respective gas enclosures by at least such a distance. It is known that such separations may result in significant reductions in the pump speeds (i.e., the rate at which gases are evacuated by a pump) of cryopumps.

By contrast, the inlet face 116 of the cryopump 38 of the present disclosure extends into the wall 124 of the process chamber 32, and perhaps even into the interior of the process chamber 32 (i.e., if the distance d in FIG. 4 is greater than the thickness of the wall 124 in FIG. 5). The working surfaces of the cryopump 38 are thereby positioned immediately adjacent or within the interior of the process chamber 32 and therefore immediately adjacent or within any gases that are to be evacuated therefrom. The cryopump 38 therefore does not suffer the above-described loses in pump speed and may thus realize the full, or near full, potential pump speed of the cryopump 38 during operation. A fewer number of cryopumps may therefore be implemented in a given gas enclosure in order to achieve a desired total rate of gas evacuation.

Figure 6:
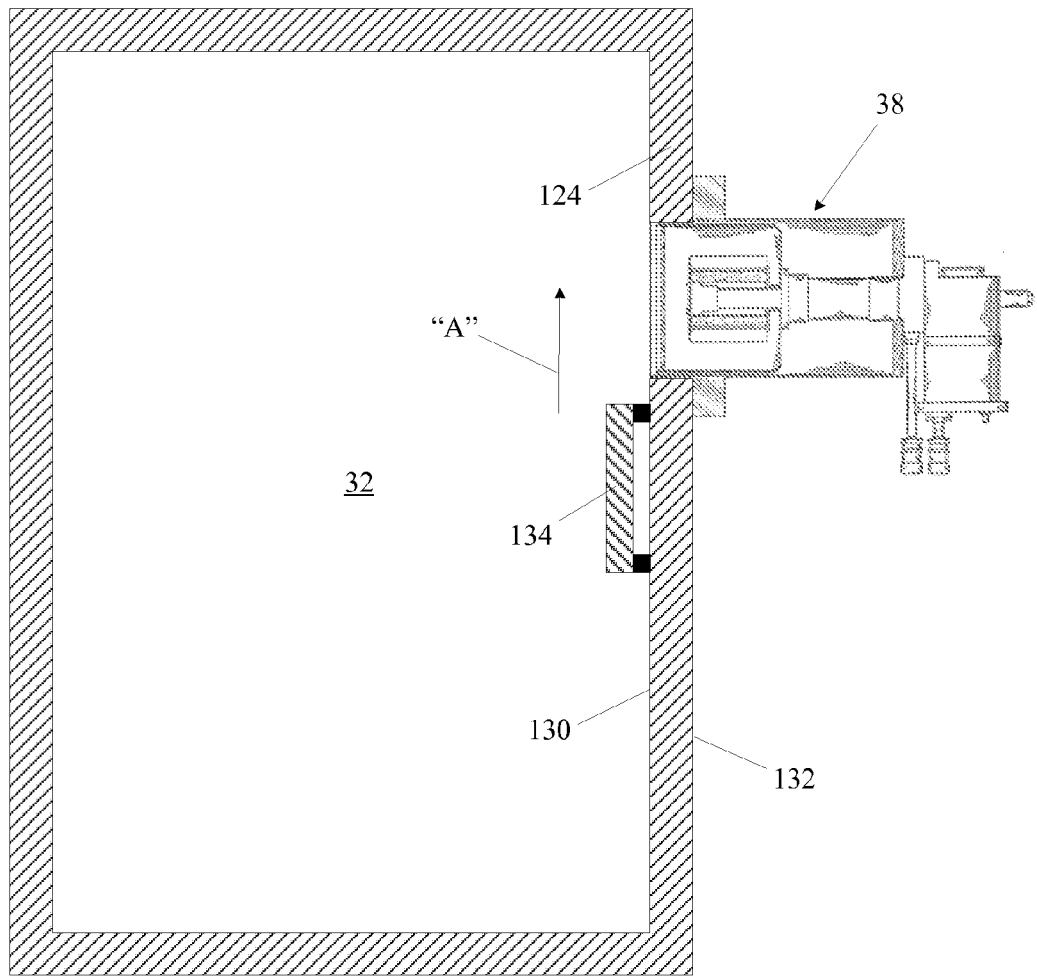
FIG. 6 is a view in section illustrating the cryogenic pump shown in FIG. 4 mounted to the wall of process chamber with an isolation valve in an open position.
Figure 7:
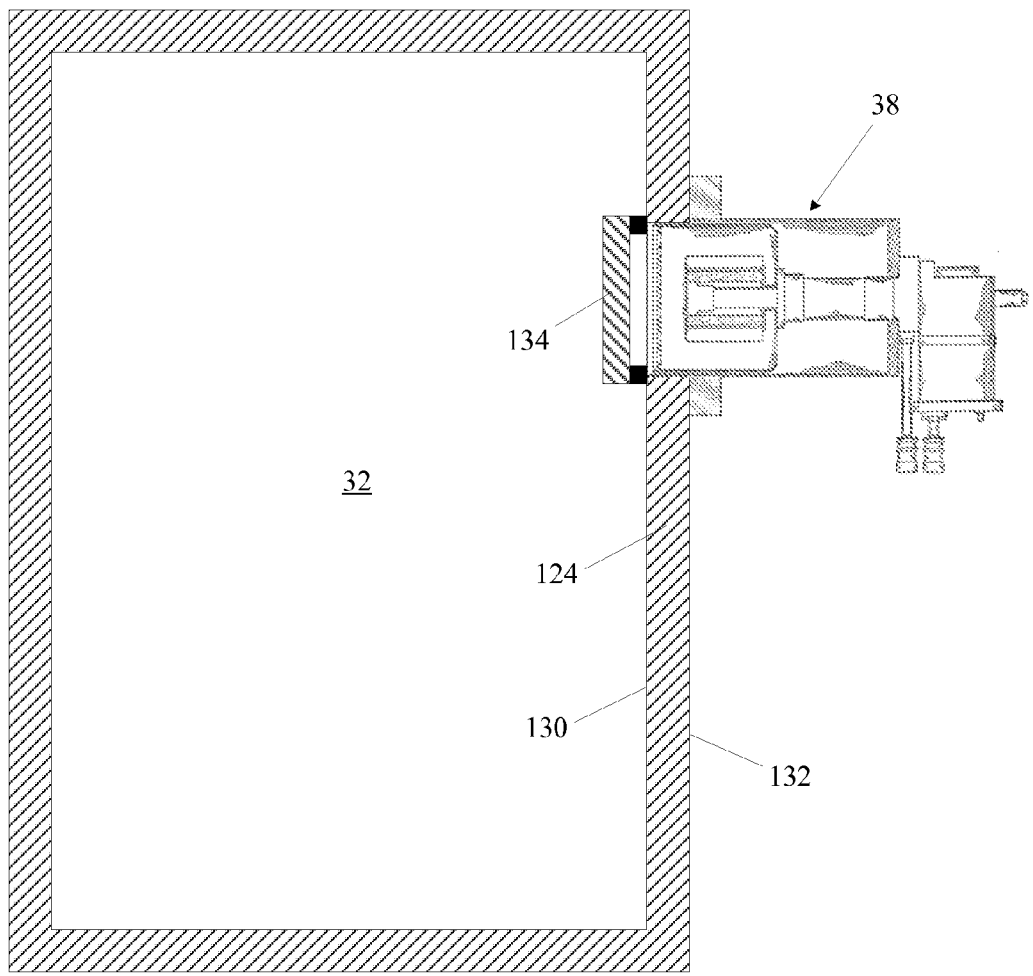
FIG. 7 is a view in section illustrating the cryogenic pump shown in FIG. 4 mounted to the wall of process chamber with an isolation valve in a closed position.

At times, it may be desirable to seal the cryopump 38 from the interior of the process chamber 32 so that the working surfaces of the cryopump 38 may be regenerated by removing condensate therefrom. To that end, referring to FIG. 6, an isolation valve 134 may be operably mounted to the interior surface 130 of the wall of the process chamber 32 and may be movable between an open position (as shown in FIG. 6), wherein the cryopump is open to, and is in fluid communication with, the interior of the process chamber 32, and a closed position (as shown in FIG. 7), wherein the isolation valve 134 covers the aperture 128 and seals the interior of the process chamber 32 from the cryopump 38. Thus, movement from the open to closed positions is effected by moving the valve 134 in the direction of arrow "A." The isolation valve 134 may be any type of valve suitable for being employed in this manner, including, but not limited to, a door-style isolation valve.

The configuration of the isolation valve 134 is to be contrasted with other isolation valves that are commonly employed in similar applications, wherein such valves are typically mounted on an exterior surface of a process chamber, intermediate a process chamber wall and a cryopump. Such isolation valve configurations result in the associated cryopump being separated from the interior of the associated process chamber by the intermediately positioned isolation valves, thereby causing further reductions in pump speeds (i.e., further to reductions that are attributable to process chamber wall thicknesses as described above).

Since the isolation valve 132 of the present disclosure is mounted to the interior surface 130 of the wall 124 of the process chamber 32, the cryopump 38 may be mounted directly to the exterior surface 132 of the process chamber wall 124 without any intervening structures therebetween. The inlet face 116 of the cryopump 38 may therefore be disposed immediately adjacent or within the interior of the process chamber 32 as described above, thereby mitigating or eliminating losses in pump speed while preserving the ability of the isolation valve 132 to effectively seal the process chamber 32 from the cryopump 38 when necessary (e.g., to regenerate the working surfaces of the cryopump 38).

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. An ion implanter arrangement comprising:
   a gas enclosure defined by a wall having an exterior surface and an interior surface;
   a semiconductor process pump mounted on the wall, the semiconductor process pump comprising:
   a housing having an inlet port;
   a working surface disposed within the housing; and
   a mounting flange disposed on an exterior of the housing and fastened to the exterior surface of the wall;
   wherein the housing extends from the mounting flange into an aperture that extends through the wall.

2. The ion implanter in accordance with claim 1, wherein a forward-most terminus of the inlet port defines an inlet face that is flush with the interior surface of the wall.

3. The ion implanter in accordance with claim 1, wherein a forward-most terminus of the inlet port defines an inlet face that is disposed between the exterior surface and interior surface of the wall.

4. The ion implanter in accordance with claim 1, wherein a forward-most terminus of the inlet port defines an inlet face that is disposed within the gas enclosure.

5. The ion implanter in accordance with claim 1, wherein the semiconductor process pump is a turbomolecular pump.

6. The ion implanter in accordance with claim 1 wherein the semiconductor process pump is a cryogenic pump.

7. The ion implanter in accordance with claim 1, wherein the gas enclosure is an ion source chamber.

8. The ion implanter in accordance with claim 1, wherein the gas enclosure is a process chamber.

9. The ion implanter in accordance with claim 1, further comprising an isolation valve mounted to the interior surface of the wall, wherein the isolation valve is movable between an open position in which the isolation valve does not seal the aperture, and a closed position in which the isolation valve seals the aperture in the wall.

10. The ion implanter in accordance with claim 9, wherein the isolation valve comprises a door that is movable between the open and closed position.

* * * * *